United States Patent
Chang et al.

(10) Patent No.: US 9,508,835 B2
(45) Date of Patent: Nov. 29, 2016

(54) NON-VOLATILE MEMORY STRUCTURE AND MANUFACTURING METHOD THEREOF

(71) Applicant: UNITED MICROELECTRONICS CORP., Hsin-Chu (TW)

(72) Inventors: Wen-Chung Chang, Hsinchu (TW); Shen-De Wang, Hsinchu County (TW); Ya-Huei Huang, Tainan (TW); Feng-Ji Tsai, Hsinchu (TW); Chien-Hung Chen, Hsin-Chu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 14 days.

(21) Appl. No.: 13/741,399

(22) Filed: Jan. 15, 2013

(65) Prior Publication Data

US 2014/0197472 A1    Jul. 17, 2014

(51) Int. Cl.
*H01L 27/115* (2006.01)
*H01L 29/66* (2006.01)
*H01L 29/792* (2006.01)
*H01L 29/423* (2006.01)
*H01L 21/28* (2006.01)

(52) U.S. Cl.
CPC ... *H01L 29/66833* (2013.01); *H01L 21/28282* (2013.01); *H01L 27/11573* (2013.01); *H01L 27/11575* (2013.01); *H01L 29/4234* (2013.01); *H01L 29/792* (2013.01)

(58) Field of Classification Search
CPC .............. H01L 27/11573; H01L 27/11575
USPC ............................ 257/324, E21.21
See application file for complete search history.

(56) References Cited

U.S. PATENT DOCUMENTS

| | | | | |
|---|---|---|---|---|
| 5,751,037 | A * | 5/1998 | Aozasa | H01L 21/28282 257/315 |
| 6,376,879 | B2 * | 4/2002 | Mori | H01L 21/76897 257/346 |
| 6,656,794 | B2 * | 12/2003 | Shibata | 438/258 |
| 7,049,189 | B2 | 5/2006 | Chang et al. | |
| 7,119,394 | B2 | 10/2006 | Hsieh et al. | |
| 2004/0183106 | A1 | 9/2004 | Kim et al. | |
| 2009/0159960 | A1 | 6/2009 | Mori | |
| 2012/0018795 | A1 | 1/2012 | Chen et al. | |

FOREIGN PATENT DOCUMENTS

TW    201205786 A1    2/2012

* cited by examiner

*Primary Examiner* — Amar Movva
(74) *Attorney, Agent, or Firm* — Winston Hsu; Scott Margo

(57) ABSTRACT

A method for manufacturing a non-volatile memory structure includes providing a substrate having a memory region and a logic region defined thereon, masking the logic region while forming at least a first gate in the memory region, forming an oxide-nitride-oxide (ONO) structure under the first gate, forming an oxide structure covering the ONO structure on the substrate, masking the memory region while forming a second gate in the logic region, and forming a first spacer on sidewalls of the first gate and a second spacer on sidewalls of the second gate simultaneously.

10 Claims, 6 Drawing Sheets

NON-VOLATILE MEMORY STRUCTURE AND MANUFACTURING METHOD THEREOF

BACKGROUND OF THE INVENTION

1. Field of the Invention

The present invention relates to a non-volatile memory structure and a manufacturing method thereof, and more particularly, to a silicon-oxide-nitride-oxide-semiconductor (hereinafter abbreviated as SONOS) non-volatile memory structure and a manufacturing method thereof.

2. Description of the Prior Art

Semiconductor memory devices are prevalently used in computer and electronics industries as a means for retaining digital information. Typically, the semiconductor memory devices are divided into volatile and non-volatile memory devices depending on whether the data stored in the memory devices is completely lost or not in case of power interruption. And the non-volatile memory devices, which can retain their data even when the power supply is interrupted, have been widely employed.

In the conventional non-volatile memory technology, a SONOS memory structure is to build a silicon nitride layer sandwiched between two silicon oxide layers for serving as the charge trap layer while the two silicon oxide layers respectively serve as a charge tunnel layer and a charge block layer. This oxide-nitride-oxide (ONO) multilayered structure is further formed between a semiconductor substrate and a silicon floating gate, and thus a SONOS memory structure is constructed.

Since the microprocessors have become more powerful, requirement to memory devices of large-capacity and low-cost is raised. To satisfy such trend and achieve challenge of high integration in semiconductor devices, memory miniaturization is kept on going, and thus fabrication process of memory structure is getting complicated. Furthermore, it is observed that the elements for constructing semiconductor devices are getting more and more susceptible to the process and thus the process control for ensuring yield and performance of the semiconductor devices becomes more and more important. For example, the nitride layer, which serves as the charge trapping layer, plays the essential role for storing data, therefore it is always important to protect the nitride layer in the fabrication process.

SUMMARY OF THE INVENTION

According to the claimed invention, a method for manufacturing a non-volatile memory structure is provided. The method first provides a substrate having a memory region and a logic region defined thereon, and a dielectric layer and a conductive layer are sequentially formed on the substrate. Next, the logic region is masked while the dielectric layer and the conductive layer in the memory region are etched to form at least a first gate in the memory region. After forming the first gate, a local oxide-nitride-oxide (ONO) structure is formed under the first gate and near sidewalls of the first gate. Subsequently, an oxide structure covering the ONO structure is formed on the substrate. After forming the oxide structure, the memory region is masked while the conductive layer and the dielectric layer in the logic region are etched to form at least a second gate in the logic region. After forming the second gate, a first spacer is formed on sidewalls of the first gate and a second spacer is formed on sidewalls of the second gate simultaneously.

According to the claimed invention, a non-volatile memory structure is provided. The non-volatile memory structure includes a substrate having a memory region and a logic region defined thereon, a first gate forming in the memory region and a second gate formed in the logic region, an ONO structure disposed under the first gate, an oxide structure disposed on sidewalls of the first gate, and a first spacer disposed on the sidewalls of the first gate and a second spacer disposed on sidewalls of the second gate.

Accordingly, the method for manufacturing the non-volatile memory structure provided by the present invention is easily integrated to the state-of-the-art logic fabrication processes. More important, by forming the oxide structure to cover the ONO structure, particularly the nitride layer of the ONO structure, the nitride layer is protected from damages generated in the following processes. And thus the charge trapping function of the nitride layer is ensured. Accordingly, electrical performance of the non-volatile memory structure provided by the present invention is ensured.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-9 are schematic drawings illustrating a method for manufacturing a non-volatile memory structure provided by a preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, and FIG. 9 is a schematic drawing in a step subsequent to FIG. 8.

FIGS. 10-11 are schematic drawings illustrating a method for manufacturing a non-volatile memory structure provided by a modification to the present invention, wherein FIG. 11 is a schematic drawing in a step subsequent to FIG. 10.

DETAILED DESCRIPTION

Figure 1:
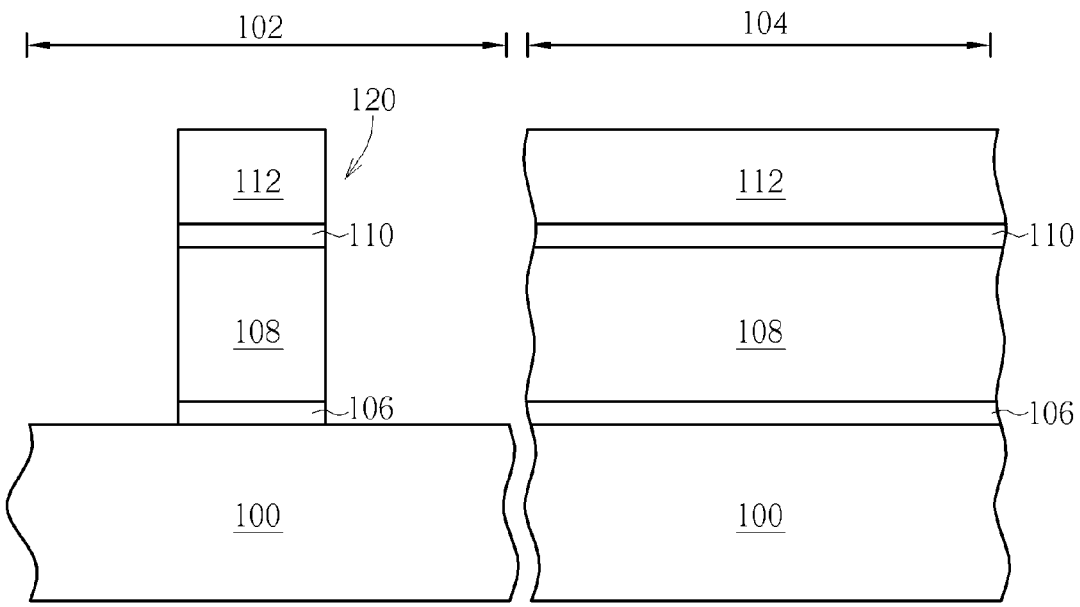

Please refer to FIGS. 1-9, which are drawings illustrating a method for manufacturing a non-volatile memory structure provided by a preferred embodiment of the present invention. As shown in FIG. 1, a substrate 100 is first provided. The substrate 100 can be a silicon substrate, but not limited to this. The substrate 100 includes a memory region 102 and a logic region 104 defined thereon. A dielectric layer 106 and a conductive layer 108 are sequentially formed on a surface of the substrate 100. In the preferred embodiment, the dielectric layer 106 is a silicon oxide layer formed by methods such as thermal oxidation or deposition, and the conductive layer is a polysilicon layer, but not limited to this. Additionally, p-wells and/or n-wells (not shown)

required by different semiconductor devices can be formed in the substrate 100 in advance.

Please still refer to FIG. 1. Next, a masking layer 110 and a photoresist layer 112 are sequentially formed on the substrate 100. It is noteworthy that the masking layer 110 and the photoresist layer 112 cover the entire logic region 104 while the photoresist layer 112 is patterned to define a gate in the memory region 102. Subsequently, an etching process is performed to etch the masking layer 110, the conductive layer 108 and the dielectric layer 106 exposed by the patterned photoresist layer 112 to form at least a first gate 120 in the memory region 102 while the logic region 102 is masked and protected during the etching process. As shown in FIG. 1, the first gate 120 includes at least the conductive layer 108 and the dielectric layer 106.

Figure 2:
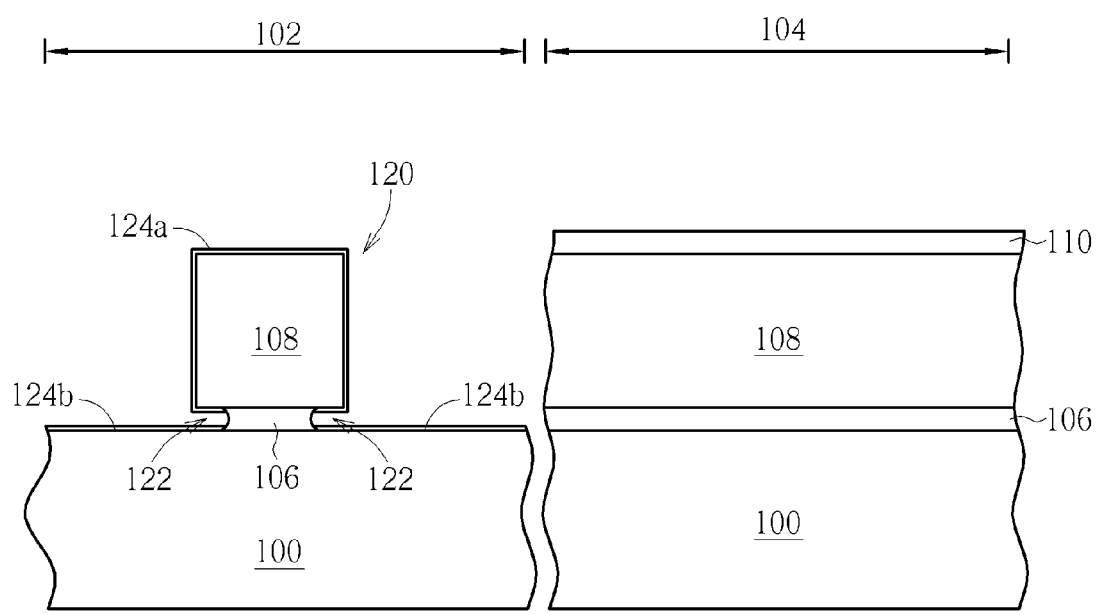

Please refer to FIG. 2. Then, the photoresist layer 112 and the masking layer 110 are removed and followed by etching portions of the dielectric layer 106 under the first gate 120. Consequently, cavities 122 are formed in the dielectric layer 106 under the first gate 120. After forming the cavities 122, a first oxide layer 124a/124b is formed on the substrate 100. It is noteworthy that because the conductive layer 108 and the substrate 100 include silicon material in the preferred embodiment, it is more preferable that the first oxide layer 124a/124b is formed by a thermal oxidation. Accordingly, the first oxide layer 124a/124b is formed on any exposed silicon material. As shown in FIG. 2, the first oxide layer 124a is therefore formed on top, sidewalls and portions of bottom of the conductive layer 108 of the first gate 120, and the first oxide layer 124b is formed on portions of the substrate 100.

Figure 3:
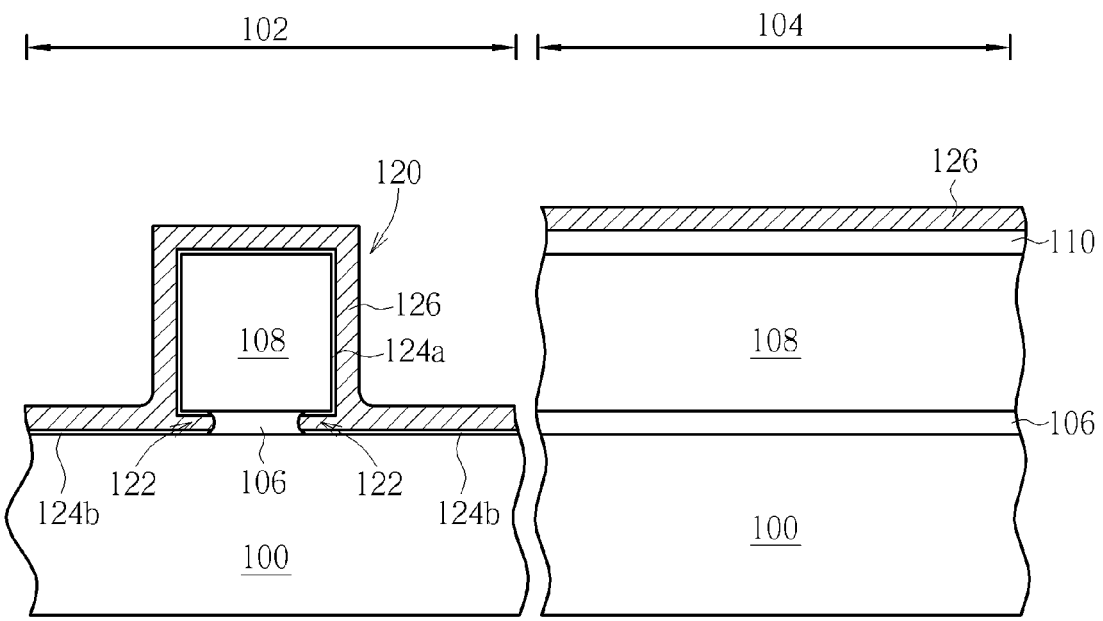
Figure 4:
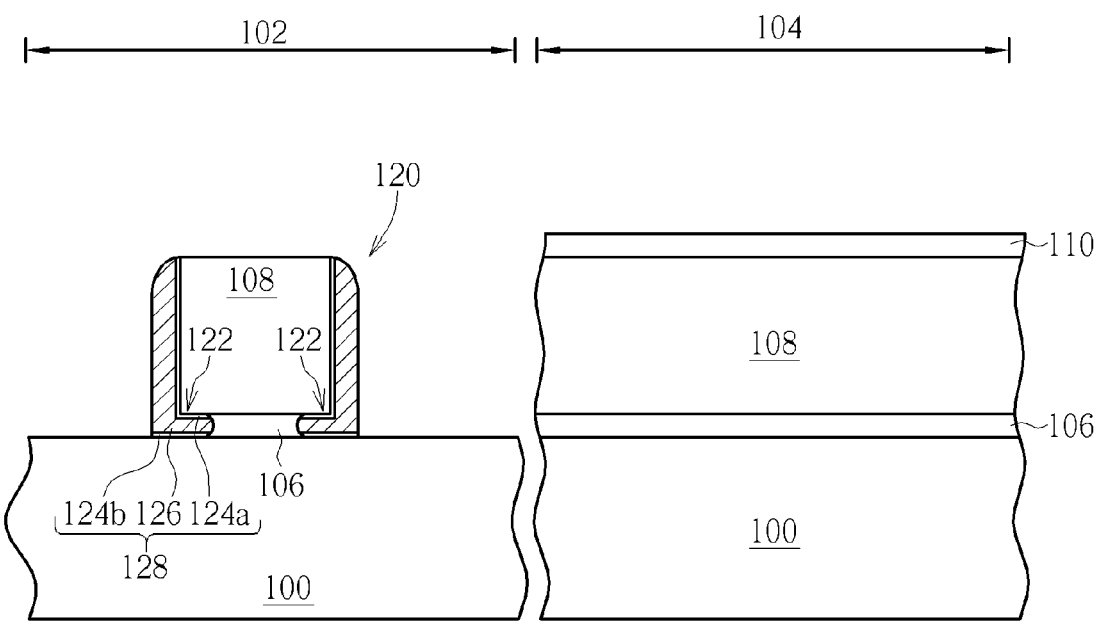

Please refer to FIGS. 3-4. After forming the first oxide layer 124a/124b, a first nitride layer 126 is formed on the substrate 100. It should be noted that the cavities 122 are filled with the first nitride layer 126 as shown in FIG. 3. Next, an etching back process is performed to remove portions of the first nitride layer 126 and the first oxide layer 124a/124b from the top of the first gate 120 and from portions of the substrate 100. Therefore an ONO structure 128 filling up the cavity 122 is formed under the first gate 120. As shown in FIG. 4, the ONO structure 128 includes the first oxide layer 124a formed under the bottom of the conductive layer 108 of the first gate 120, the first oxide layer 124b formed on the surface of the substrate 100, and the first nitride layer 126 sandwiched between the first oxide layers 124a/124b. As shown in FIG. 4, the ONO structure 128 is formed under the first gate 120 and near sidewalls of the first gate 120. It is also noteworthy that the first nitride layer 126 obtains an L shape after the etching back process, and a portion of the first nitride layer 126 covers the sidewalls of the first gate 120, as shown in FIG. 4. Since the ONO structure 128 is disposed on the semiconductor substrate 100 and covered by the conductive layer 108 severing as the control gate, a SONOS memory structure is obtained.

Figure 5:
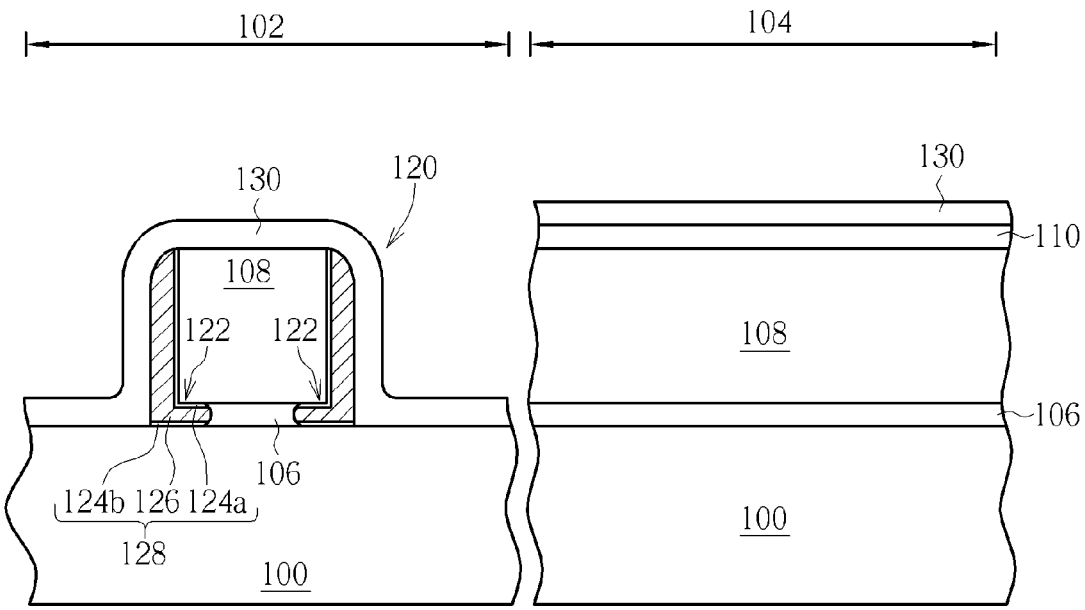
Figure 6:
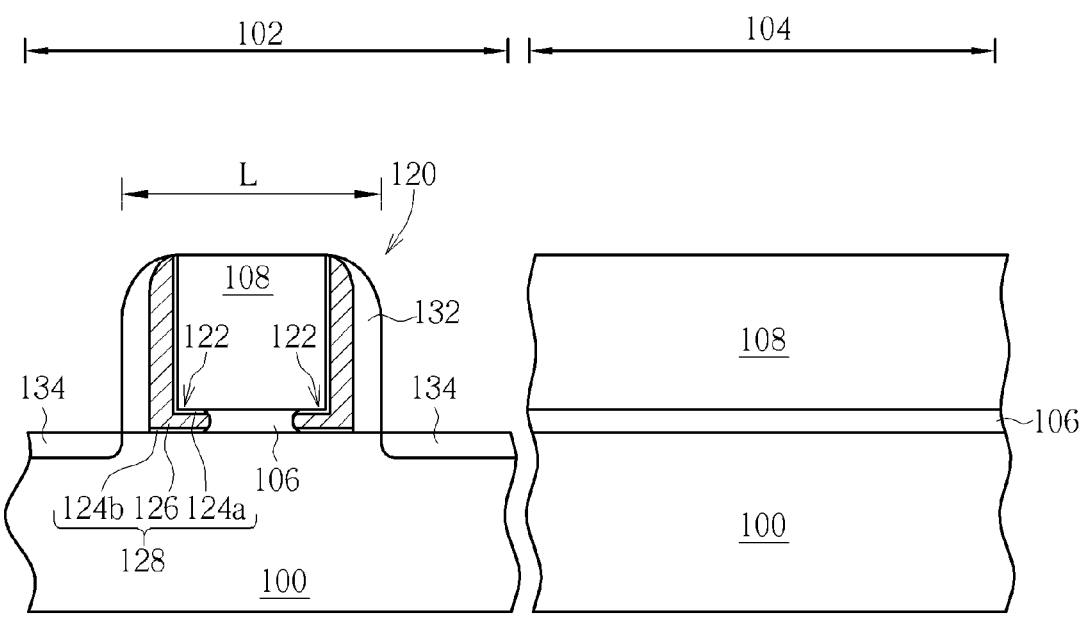

Please refer to FIGS. 5-6. After forming the ONO structure 128, a second oxide layer 130, for example but not limited to a tetra-ethyl-ortho-silicate (TEOS) layer, is formed on the substrate 100. According to the preferred embodiment, a thickness of the second oxide layer 130 is between 100 angstroms (Å) and 1000 Å, but not limited to this. Next, another etching back process is performed to remove portions of the second oxide layer 130, and thus an oxide structure 132 is formed on the sidewalls of the first gate 120 to cover the first nitride layer 126 and the ONO structure 128. Additionally, the second oxide layer 130 is completely removed from the logic region 104. It should be noted that a thickness of the oxide structure 132, which is formed by performing the etching back process, is between 50 Å and 600 Å. Please refer to FIG. 6. After forming the oxide structure 132, an ion implantation is performed to form first lightly-doped drains (LDDs) 134 in the substrate 100 at two respective sides of the first gate 120. As mentioned above, the logic region 104 is still masked and protected by the masking layer 110 during forming the first LDDs 134 by the ion implantation.

Figure 7:
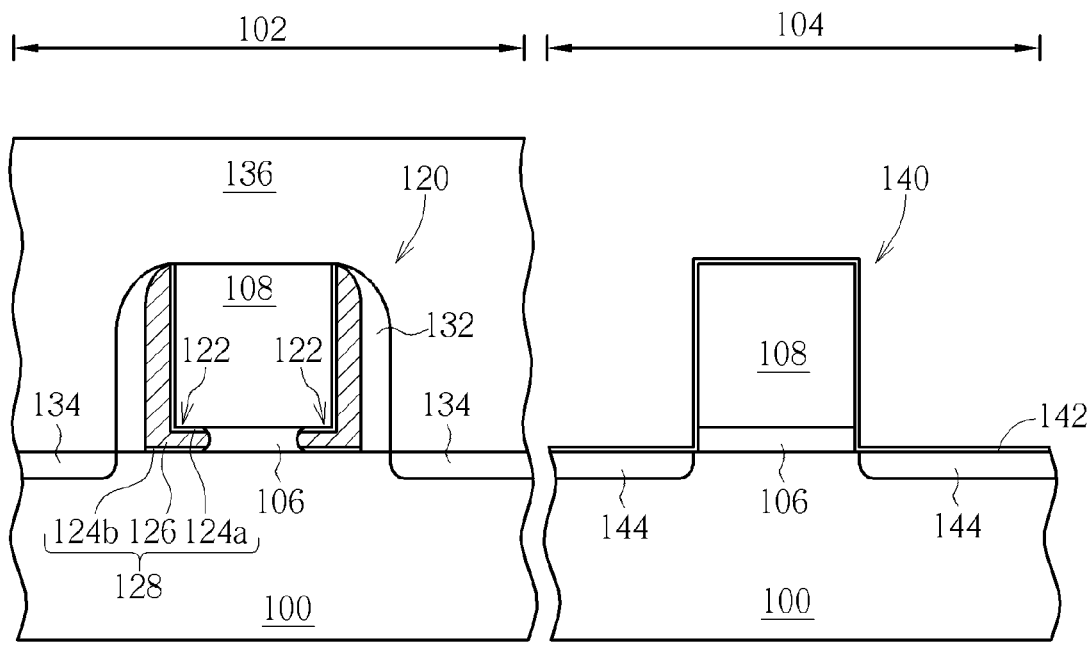

Please refer to FIG. 7. After forming the first LDDs 134, a masking layer 136 is formed in the memory region 102. Then, the conductive layer 108 and the dielectric layer 104 are etched to form at least a second gate 140 in the logic region 102. It is noteworthy that the dielectric 106 can be remained on the substrate 100 in the logic region 104 after forming the second gate 140, and a thickness of the remnant dielectric layer 106 is about 1-100 angstroms. After forming the second gate 140, a pad oxide layer 142 is subsequently formed on the substrate 100. Next, an ion implantation is performed to form second LDDs 144 in the substrate 100 at two respective sides of the second gate 140.

Figure 8:
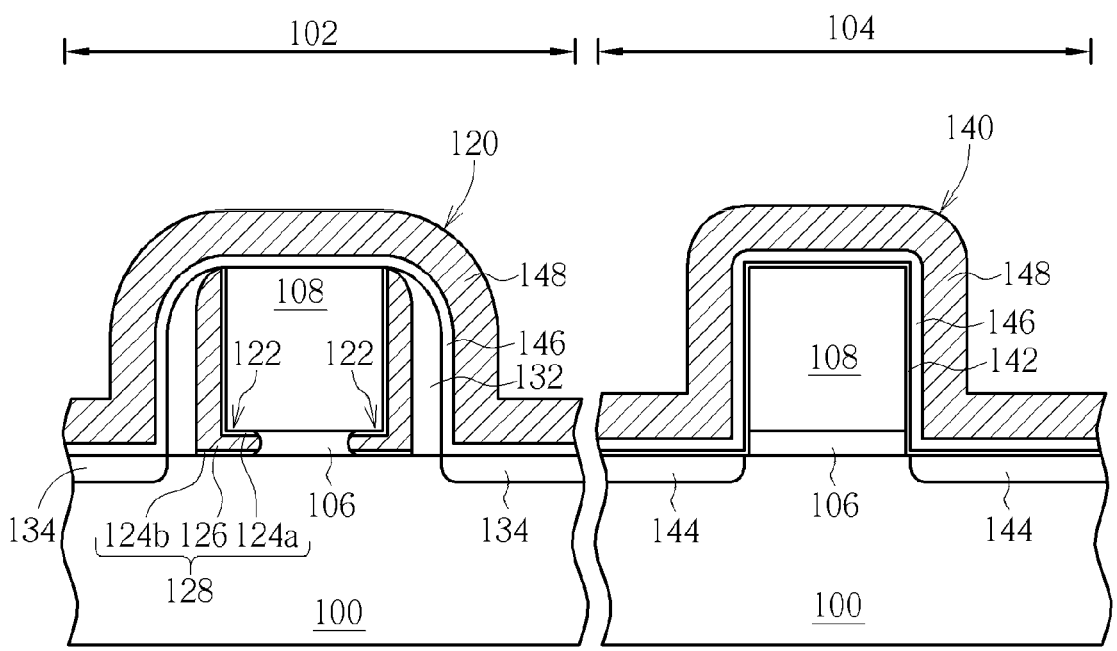

Please refer to FIG. 8. After forming the second LDDs 144, the masking layer 136 is removed from the memory region 102. It should be noted that FIGS. 1-6 and its relative descriptions are disclosed to manifest steps for forming the constructing elements in the memory region 102, and FIG. 7 and its relative description are disclosed to manifest steps for forming the constructing elements in the logic region 104. In other words, the constructing elements in the memory region 102 and the constructing elements in the logic region 104 are formed separately. More important, after forming the second LDDs 144 and removing the masking layer 136, the constructing elements in both of the memory region 102 and the logic region 104 are formed together. As shown in FIG. 8, a third oxide layer 146 and a second nitride layer 148 are sequentially formed on the substrate 100 both in the memory region 102 and the logic region 104.

Figure 9:
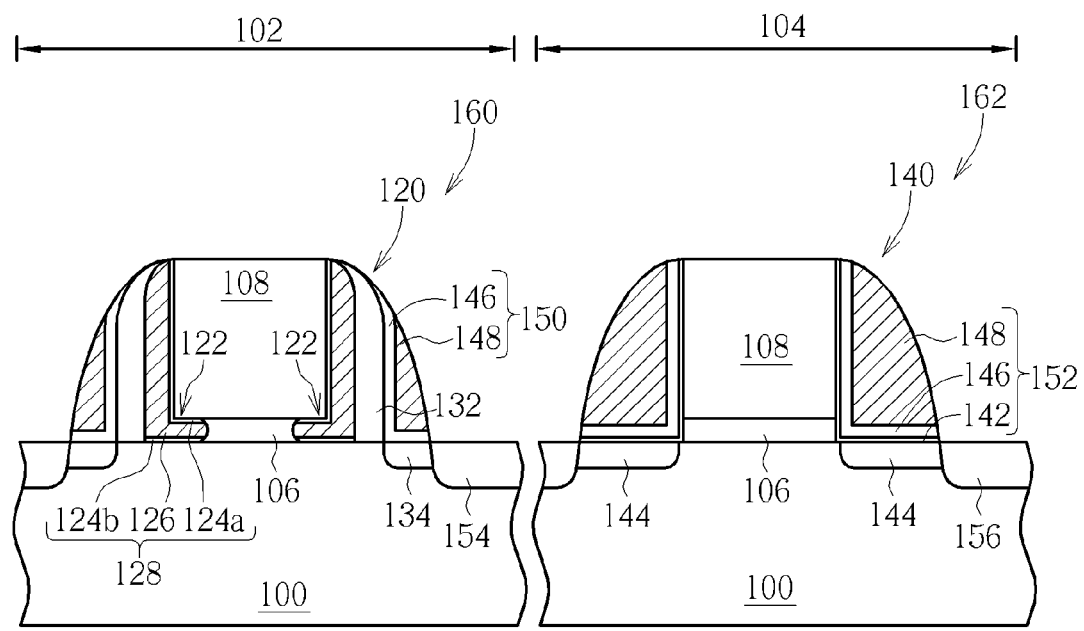

Please refer to FIG. 9. After forming the third oxide layer 146 and the second nitride layer 148, an etching back process is performed to remove portions of the second nitride layer 148 and the third oxide layer 146, and thus a first spacer 150 is formed on the sidewalls of the first gate 120 and a second spacer 152 is formed on the sidewalls of the second gate 140, simultaneously. As shown in FIG. 9, in the memory region 102, the first spacer 150 includes the second nitride layer 148 and the third oxide layer 146, however in the logic region 104, the second spacer 152 includes the second nitride layer 148, the third oxide layer 146, and the pad oxide layer 142. Furthermore, as shown in FIG. 9, the oxide structure 132 is sandwiched between the ONO structure 128 and the third oxide layer 146.

Please still refer to FIG. 9. After forming the first spacer 150 and the second spacer 152, a first source/drain 154 is formed in the substrate 100 at two respective sides of the first gate 120 and a second source/drain 156 is formed in the substrate 100 at two respective sides of the second gate 140. Accordingly, a memory device 160 is obtained in the memory region 102 and a logic device 162 is obtained in the logic region 104.

Accordingly, the method for manufacturing the nonvolatile memory structure provided by the present invention is easily integrated to the state-of-the-art logic fabrication processes. More important, by forming the oxide structure 132 to cover the ONO structure 128, particularly to cover the first nitride layer 126 of the ONO structure 128, the first nitride layer 126 is protected from damages generated in the following processes. And thus the charge trapping function of the first nitride layer 126 is ensured.

Figure 10:
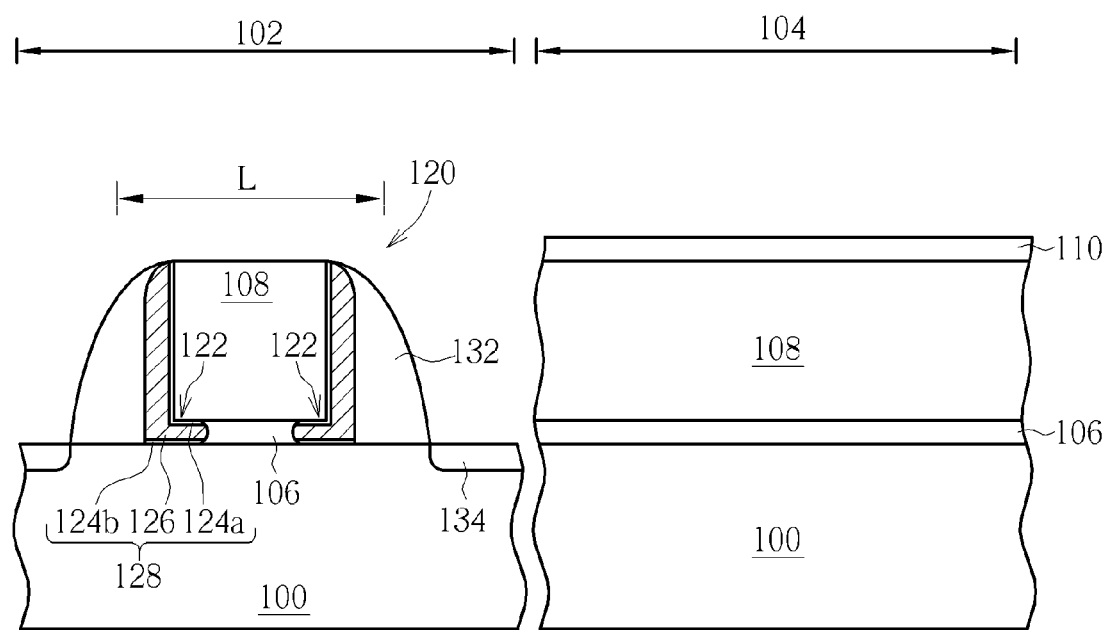
Figure 11:
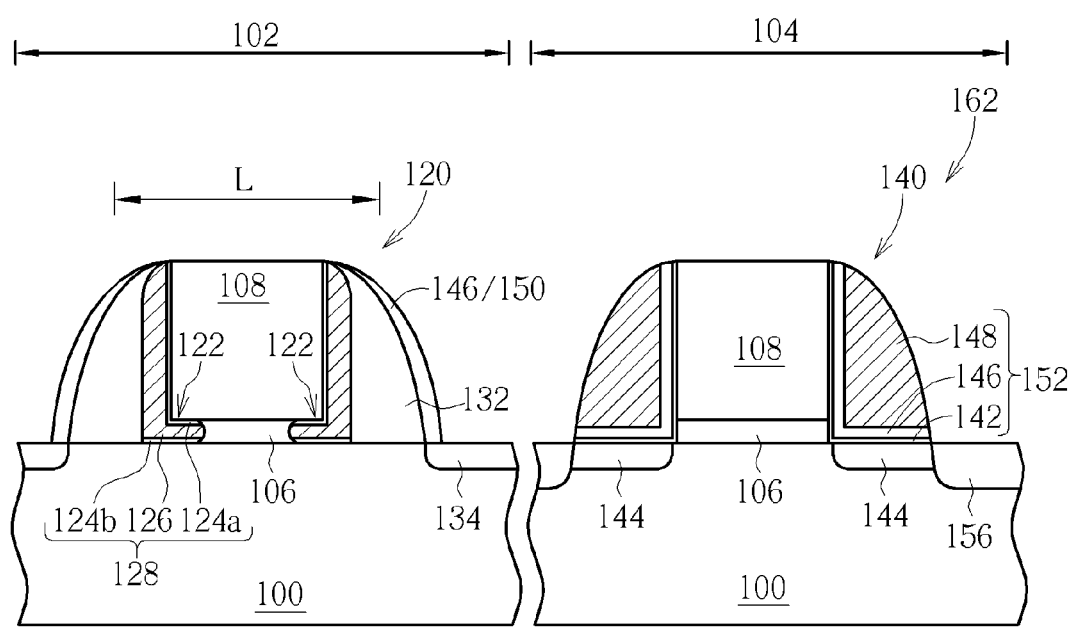

Please refer to FIGS. 10-11, which are schematic drawings illustrating a method for manufacturing a non-volatile memory structure provided by a modification to the present invention. It is well-known to those skilled in the art that after forming the first LDDs 134, the profiles of the first LDDs 134 are always susceptible to the thermal treatment and diffusion toward the center of the first gate 120 is often found. If the diffusion is so severe that the first LDDs 134 is overlapped with the ONO structure 128, the electrical performance of the control gate and the whole memory device are adversely impacted. To overcome such diffusion problem, a width of the first gate 120 and a thickness of the second oxide layer 130/the oxide structure 132 are adjusted according to the modification. Consequently, relative position of the first LDDs 134 with regard to the ONO structure 128 can be optimized based on the memory performance without modifying any compatible logic process. In order to clearly describe the differences, FIG. 6 and FIG. 10 should be referred together: According to the instant modification, the width of the first gate 120 is reduced and the thickness of the oxide structure 132 is increased as shown in FIG. 10 while the effective channel length L is maintained the same with the channel length L shown in FIG. 6. Accordingly, the first LDDs 134 are farther from the ONO structure 128 comparing the instant modification shown in FIG. 10 and the present embodiment shown in FIG. 6. Therefore, the diffusion issue of the first LDDs 134 is mitigated and its adverse impact to the SONOS memory structure is prevented.

Please refer to FIG. 11. After forming the second gate 140, the pad oxide layer 142 and the second LDDs 144 in the logic region 104, a third oxide layer 146 and a second nitride layer 148 are sequentially formed on the substrate 100 and followed by performing an etching back process as mentioned above. It is noteworthy that because the thickness of the oxide structure 132 is larger in the instant modification, a flatter profile is obtained, and the third oxide layer 146 and the second nitride layer 148 formed thereon inheritably obtain the flatter profile. More important, the second nitride layer 148 with such flatter profile is etched and removed much easier. The second nitride layer 148 with such flatter profile is even removed entirely as shown in FIG. 11. Therefore in the instant modification, the first spacer 150 in the memory region 102 may include only the remnant third oxide layer 146 while the second spacer 152 in the logic region 104 includes the second nitride layer 148, the third oxide layer 146 and the pad oxide layer 142. It is also noticeable that though the first spacer 150 includes only the third oxide layer 146 in accordance with the instant modification, an overall thickness of the first spacer 150 and the oxide structure 132 still work to define where the first source/drain (not shown) is to be formed. In other words, even though the oxide structure 132 is so thick that the first spacer 150 no longer includes the second nitride layer 148, the first source/drain is still formed without any problem according to the instant modification.

According to the instant modification, the diffusion issue of the first LDDs 134 is mitigated and its adverse influence is prevented by adjusting distance between the first LDDs 134 and the ONO structure 128, which is accomplished by reducing the width of the first gate 120 and increasing the thickness of the oxide structure 132 while the channel length L is maintained as original design. Furthermore, though the second nitride layer 148 is entirely removed and thus the first spacer 150 in the memory region 102 may include only the third oxide layer 146 due to the thicker oxide structure 132 has sufficient thickness and thus still renders protection to the ONO structure 128 and the first nitride layer 126. Additionally, though the first spacer 150 in the memory region 102 may include only the third oxide layer 146, the first source/drain is still formed without any problem according to the instant modification.

Accordingly, the method for manufacturing the non-volatile memory structure provided by the present invention is easily integrated to the state-of-the-art logic fabrication processes without rendering any impact. More important, by forming the oxide structure to cover the ONO structure, particularly to cover the nitride layer of the ONO structure, the nitride layer is protected from damages. And thus the charge trapping function of the nitride layer is ensured. Accordingly, electrical performance of the non-volatile memory structure provided by the present invention is ensured. Furthermore, by reducing the width of the gate structure and increasing the thickness of the oxide structure while the channel length L is maintained as original design, relative position of the LDDs with regard to the ONO structure is optimized and thus the diffusion issue is mitigated and its adverse influence to the SONOS memory structure is prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory structure comprising:
   a substrate having a memory region and a logic region defined thereon;
   a first gate formed in the memory region and a second gate formed in the logic region, wherein the first gate acts both a control gate and a word gate without having a separate control gate;
   an ONO structure disposed under the first gate, the ONO structure contacting the substrate and entire sidewalls of the first gate in a cross-sectional view, the ONO structure comprising a first nitride layer and the first nitride layer comprising a L shape;
   an oxide structure disposed on sidewalls of the first gate; and
   a first spacer disposed on the sidewalls of the first gate and a second spacer disposed on sidewalls of the second gate.

2. The non-volatile memory structure according to claim 1, wherein the first gate and the second gate respectively comprise a conductive layer and a dielectric layer.

3. The non-volatile memory structure according to claim 2, wherein the ONO structure further comprises:
   first oxide layers formed on a bottom of the conductive layer and on the substrate under the first gate; and
   a portion of the first nitride layer being sandwiched between the first oxide layers and a portion of the first nitride layer covering on the sidewalls of the first gate.

4. The non-volatile memory structure according to claim 1, wherein a thickness of the oxide structure is between 50 Å and 600 Å.

5. The non-volatile memory structure according to claim 1, wherein the first spacer and the second spacer respectively comprise at least a second oxide layer.

6. The non-volatile memory structure according to claim 5, wherein the oxide structure is sandwiched between the ONO structure and the second oxide layer.

7. The non-volatile memory structure according to claim 5, wherein the second spacer further comprises a second nitride layer formed on the second oxide layer.

8. The non-volatile memory structure according to claim 1, further comprising first LDDs formed in the substrate at two respective sides of the first gate and second LDDs formed in the substrate at two respective sides of the second gate.

9. The non-volatile memory structure according to claim 1, further comprising a first source/drain in the substrate at two respective sides of the first gate and a second source/drain formed in the substrate at two respective sides of the second gate.

10. A non-volatile memory structure comprising: a semiconductor substrate having a memory region and a logic region defined thereon; a first gate formed in the memory region and a second gate formed in the logic region, the first gate comprising a conductive layer and a dielectric layer, and the dielectric layer being formed between the conductive layer and the semiconductor substrate, wherein the dielectric layer is beneath the conductive layer and above the semiconductor substrate, and wherein the first gate acts both a control gate and a word gate without having a separate control gate; an ONO structure disposed under the first gate, the ONO structure comprising a first nitride layer, and the ONO structure contacting the substrate, wherein the dielectric layer of the first gate is also formed between the ONO structure and the semiconductor substrate; an oxide structure is directly contacting sidewall of the first nitride layer disposed on and covering sidewalls of the first gate; and a first spacer disposed on the sidewalls of the first gate and a second spacer disposed on sidewalls of the second gate.

* * * * *